(12) United States Patent
Okumoto

(10) Patent No.: US 6,407,423 B1
(45) Date of Patent: Jun. 18, 2002

(54) STAGGERED-EDGE CAPACITOR ELECTRODE

(75) Inventor: Yasuhiro Okumoto, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/909,973

(22) Filed: Jul. 23, 2001

Related U.S. Application Data

(62) Division of application No. 09/405,270, filed on Sep. 23, 1999.
(60) Provisional application No. 60/102,387, filed on Sep. 29, 1998.

(51) Int. Cl.$^7$ .............................................. H01G 27/108
(52) U.S. Cl. ........................................ 257/306; 257/309
(58) Field of Search .................................. 257/306, 309

(56) References Cited

U.S. PATENT DOCUMENTS

| 5,513,813 A | | 5/1996 | Oehrien et al. ................ 347/52 |
| 5,696,395 A | | 12/1997 | Tseng ........................... 257/308 |
| 5,701,264 A | * | 12/1997 | Shrivastava et al. |
| 5,835,337 A | * | 11/1998 | Watanabe et al. |
| 5,891,772 A | | 4/1999 | Hsu ............................. 438/254 |
| 6,064,085 A | | 5/2000 | Wu .............................. 257/296 |

* cited by examiner

*Primary Examiner*—Stephen D. Meier
(74) *Attorney, Agent, or Firm*—Robby T. Holland; Wade James Brady, III; Frederick J. Telecky, Jr.

(57) ABSTRACT

A capacitor electrode and method of making having increased surface area because of the presence of pits in the side walls of the electrode thus increasing the capacitance of the capacitor while still maintaining the packing density of the integrated circuit.

10 Claims, 3 Drawing Sheets

US 6,407,423 B1

STAGGERED-EDGE CAPACITOR ELECTRODE

This application is a division of Ser. No. 09/405,270, filed Sep. 23, 1999 pending at time of issue which claims priority under 35 U.S.C. 119 based upon provisional application Ser. No. 60/102,387, filed Sep. 29, 1998.

BACKGROUND AND SUMMARY OF THE INVENTION

The present invention relates to integrated circuit structures and particularly to integrated capacitors having corrugated electrodes.

BACKGROUND CAPACITOR DENSITY

One of the driving factors in DRAM integration is obtaining an adequate amount of capacitance per unit cell, while the dimensions of the unit cells steadily decrease. As sensing and selection circuits are refined, the required capacitance value has decreased slightly, but it is still highly desirable to obtain a capacitance of at least 30 fF per cell, and more if possible. As integrated circuit dimensions continually shrink, this becomes more and more difficult.

In addition, capacitors for other purposes in integrated circuits are subject to the constraints of density, like any other integrated circuit function. Thus capacitors used for processing image data, for analog filtering, or for low pass filtering may all require capacitances which are relatively large at the capacitances per unit area (specific capacitance) normally attainable in integrated circuits.

Conventionally, DRAM capacitors will often use a vertically extended capacitor. For example, a capacitor which uses a cylindrical shape can be extended upwards to achieve a capacitor plate area of approximately $2\pi hr$, where r is the radius, and h is the height. (An example of such a conventional inner electrode 1210 is shown in FIG. 12.) Similarly, some quasi-cylindrical capacitors have been fabricated which include capacitor dielectric, enhanced active capacitor area, both on the interior and exterior surfaces of a cylindrical capacitor shape. Other capacitors have even used nested cylinders. However, all of these attempts run into some geometrical limitations. Examples of other capacitor geometries for the inner electrode 1210 are depicted in FIGS. 11 and 13.

Another attempt in the prior art is known as the corrugated capacitor cell DRAM. See H. Sunami et al., *A Corrugated Capacitor Cell* (CCC) *for Megabit Dynamic MOS Memories*, 4 IEEE Electron Device Letters 90–91 (1983) which is hereby incorporated by reference. This cell used an angular trench, to increase capacitance due to the electric field enhancement at the capacitor electrode structure.

Real capacitors are typically not infinite planes, but include corners or edges. At such corners and edges, the electric field, for given applied voltage, maybe enhanced by geometric effect. (For example, if the uniform voltage is supplied to a sharp needle, the electric field will highest at the tip of the sharp needle.) For further discussion of geometry dependent field enhancement see Betty Prince, SEMICONDUCTOR MEMORIES: A HANDBOOK OF DESIGN, MANUFACTURE, AND APPLICATION 626–27 (2nd ed. 1991) which is hereby incorporated by reference.
Background: Increasing Effective Capacitance by Use of Geometric Effect One way to use the electric field enhancement effect described above is to increase the capacitance of a capacitor. For example, the corrugated capacitor DRAM cell mentioned above is one example of this. Another example is the use of hemispherical polysilicon (HSP) structures as DRAM cells. In this technology, a layer of amorphous silicon is annealed in a way which causes it to form nodules. (The nodules are approximately hemispherical under very high magnification, which gives the name to this process.) Thus the surface area of the capacitor is intentionally roughened. This provides an increased effective surface area for the capacitor, and the effective capacitance is enhanced by a factor of 1.5 to 2.
Integrated Capacitor with Horizontal Corrugations The present application describes a novel type of integrated capacitor, in which lateral selective etching is used to achieve a finned or corrugated structure. Preferably a multi-layered structure is used at the starting point so the fins of the etched structure have an extremely small minimum dimension. For example, in one sample class of embodiments, the as deposited layers are successively amorphous and polycrystalline. (In one class of embodiments, this can be achieved in a single deposition run, simply by varying the temperature or other deposition parameters.) After selective etching occurs, an anneal will then cause the amorphous materials to become polycrystalline, so that the composition of the material is substantially uniform, although the corrugated surface contour has been achieved. The corrugated surface contour provides not only a larger total surface area, but also provides electric field enhancement at edge locations. Thus the structure advantageously provides increased capacitance for a given unit area and a given minimum patterning geometry. This is expected to be advantageous not only for DRAMs, but also for other integrated circuit capacitor structures.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
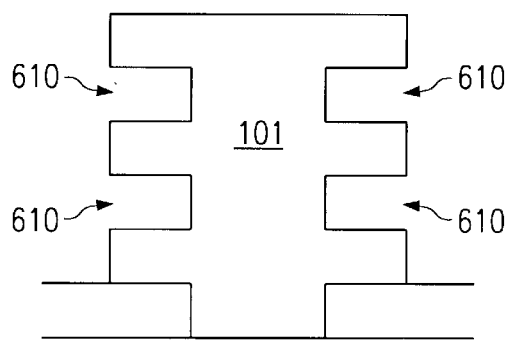
FIG. 1 shows a cross sectional view of a capacitor electrode with corrugations.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Definitions:

Back-Bias or Body-Bias: Back-bias is the voltage applied to the semiconductor material under the gate of the FET.

Body: The material within which a transistor channel is formed.

Body effect: A shift in the threshold voltage of a transistor due to capacitive coupling between the gate voltage and the body.

Bandgap: The range of energies which is normally unavailable to carriers in an undoped semiconductor. For example, the bandgap of germanium is about two-thirds of a Volt, that of silicon is slightly more than a Volt, and that of gallium arsenide is slightly less than 1½ Volts.

Carrier: In a semiconductor, an electron or hole, which can move around in the semiconductor material to enable the flow of current.

CMOS: A circuit containing at least one NMOS and at least one PMOS transistor, or a chip containing at least one such circuit.

Current leakage: Current leakage is current that escapes from the device by means other than that intended, such as through parasitic bipolar action.

Depletion: Reduction of carrier density, in a volume of semiconductor material, due to applied voltage.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diffusion Barrier: A material in which impurities have a low diffusion constant. For example, titanium nitride is often used as a conductive diffusion barrier material in silicon integrated circuit technology.

Diode: A two-terminal device. Typically a diode is rectifying, i.e. passes current in only one direction. A rectifying diode may be implemented, for example, by a P-N junction in a semiconductor material.

Dopant: An atom added to a semiconductor, which, when activated, provides a "carrier" (i.e. an electron or hole) which can move around in the semiconductor to enable the flow of current. For example, in silicon technology, boron can act as a P-type dopant, and phosphorus, arsenic, or antimony can act as an N-type dopant.

Drain: In a field-effect transistor, the diffusion to which majority carriers are emitted. For example, in an NMOS transistor, the drain will often be found connected to he more negative supply voltage (e.g. ground). In a PMOS transistor, the source will often be found connected to a positive power supply voltage.

DRAM: A dynamic random-access memory, i.e. a memory in which the stored data must be regularly read out from and written back into the cell.

Joule Heating refers to the dissipation of power when a current I is flowed through a resistance of value R. For DC current, the power dissipated is I squared times R. In analyzing thin film metallization, the resistance can be expressed as a resistance per unit length, and this formula can then be used to derive the power dissipated per unit length.

Current Crowding refers to the nonuniformity of current distribution in a solid conductor. For example, when a thin film metallization line has a neck down portion in it, the density of current (per unit cross sectional area) will increase at that location. This means that there is a higher flow of carriers per unit cross sectional area, and this higher density of carrier flow will itself accelerate the electromigration phenomenon.

Electromigration is the physical transport of material within a conductor which occurs at high current densities. In integrated circuit metallization this transport can cause a conductor to neck down and fail in service.

Gate: In a field-effect transistor, the electrode to which a control voltage is applied to modulate the conduction of the transistor.

Grain Boundary: An interface between separate grains in a polycrystalline material. The grain boundaries often have conduction and diffusion properties which are very different from those in the grains' interiors.

MOSFET: An insulated-gate field effect transistor, in which the gate is separated from the channel by a thin layer of an insulating material.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

NMOS: An n-channel field effect transistor, or a circuit or chip containing this type of transistor.

N-type: A volume of semiconductor which normally includes an excess of electrons. This can be achieved by introduction of "donor" dopants (such as phosphorus, arsenic, or antimony in silicon).

P-channel: A channel of p-type semiconductor material induced in a FET as a result of a bias applied to the gate. This channel allows carriers to flow from the source to the drain of a PMOS transistor.

P-type: A volume of semiconductor which normally includes an excess of holes. This can be achieved by introduction of "acceptor" dopants (such as boron or gallium in silicon).

PMOS: A p-channel field effect transistor, or a circuit or chip containing this type of transistor.

Polysilicon: Polycrystalline silicon.

Polycrystalline: A material which is neither monocrystalline nor amorphous, but instead includes monocrystalline grains separated by grain boundaries.

Schottky Diode: A diode formed by a metal-semiconductor interface.

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including gallium arsenide (or "GaAs"), silicon-germanium, mercury cadmium telluride, indium phosphide, gallium-indium arsenide-phosphide, and silicon carbide.

SOI: Silicon on insulator device. These devices have a steeper subthreshold slope than conventional bulk devices, thus reducing offstate current without increasing Vt.

Source: In a field-effect transistor, the diffusion from which majority carriers are emitted. For example, in an NMOS transistor, the source will often be found connected to the more negative supply voltage (e.g. ground). In a PMOS transistor, the source will often be found connected to a positive power supply voltage.

TFT: A thin film transistor, in which the channel is made of a polycrystalline (rather than monocrystalline) material.

Presently Preferred Embodiment for Forming Capacitor Electrode

Figure 2:
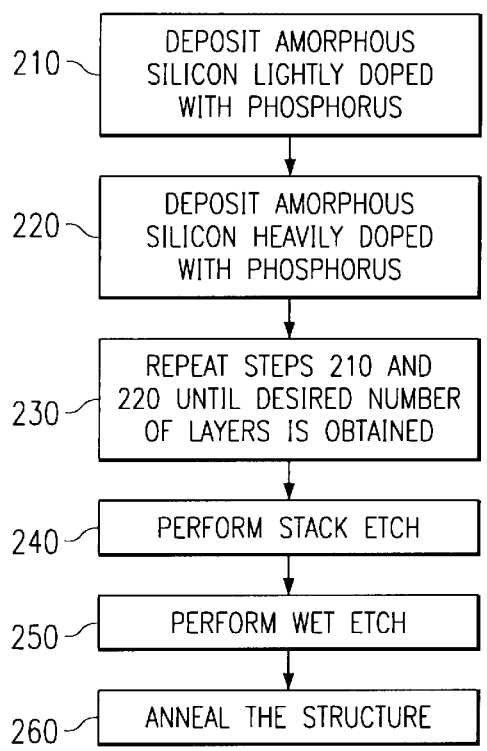
FIG. 2 is a flow chart showing key steps for forming a capacitor electrode with horizontal corrugation.
Figure 4:
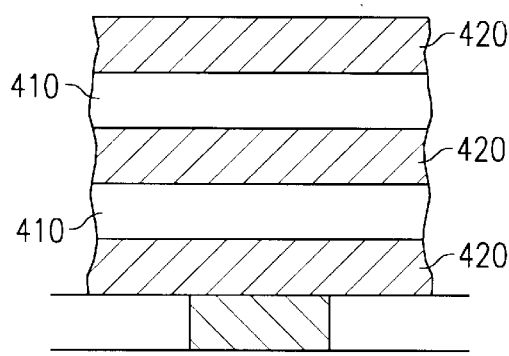
FIG. 4 shows a cross sectional view of alternating layers of amorphous silicon lightly doped with phosphorous and amorphous silicon heavily doped with phosphorous.
Figure 5:
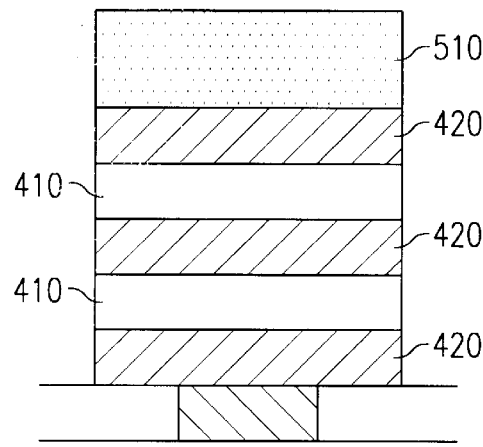
FIG. 5 shows a cross sectional view of the structure of FIG. 4 after a stack etch.

The presently preferred process embodiment will be described with reference to FIG. 2. Starting with a partially fabricated integrated circuit, deposit a layer of amorphous silicon lightly doped with phosphorous (or not doped at all) (step 210). (Note that there will be some diffusion of phosphorous from the heavily doped layers into the lightly doped areas.) Next, deposit a layer of amorphous silicon heavily doped (e.g. $10^{20}$ cm$^{-3}$) with phosphorous (step 220). Continue depositing alternating layers of heavily doped and lightly doped amorphous silicon until the desired number of layers are obtained (step 230). The resulting structure with alternating levels of amorphous silicon lightly doped with phosphorous 410 and heavily doped with phosphorous 420 is depicted in FIG. 4. Preferably, there will be three or four layers with for example 40 nm per layer depending on the final phosphorous concentration. Next, deposit photoresist 510 and perform a stack etch (step 240) to create a column of amorphous silicon whose size depends on available cell area. Typically a cell layout will be f×2f or f×3f, where "f" is the minimum lithographic dimension, and the electrode will be constructed as the largest possible oval that will fit in the cell. The resulting structure is depicted in FIG. 5. After the stack etch, remove the photoresist and perform a selective isotropic wet etch (step 250) using for example an organic alkaline with surfactant for example pyrocatechol or an organoamine base. The corrugations ideally should be etched to a depth of one quarter "f".

Figure 6:
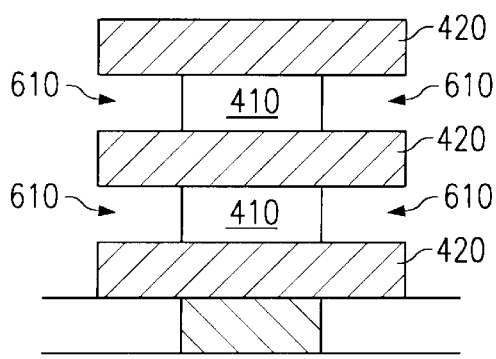
FIG. 6 shows a cross sectional view of the structure of FIG. 5 after a selective isotropic etch.

FIG. 6 depicts a cross section of the resulting structure showing the corrugations 610 etched into the heavily doped amorphous silicon regions 410 and between the lightly doped amorphous silicon regions 420. Next, the structure is annealed (step 260) to redistribute the phosphorous impurity so that the amorphous silicon has a uniform concentration of phosphorous throughout, thus forming the inner electrode 101 as depicted in FIG. 1. Note that there are no longer layers of differently doped amorphous silicon, but rather only one uniformly doped column of amorphous silicon having corrugations.

Figure 8:
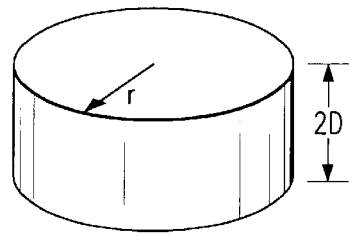
FIG. 8 shows a cross sectional view of a conventionally formed inner capacitor electrode.

Referring to FIG. 8 which represents a conventionally formed capacitor electrode, the surface area, $SA_o$, is given by the equation:

$$SA_o = 2\pi r(2D), \qquad \text{(Eqtn. 1)}$$

where r is the radius of the cylindrical stack and 2D is the thickness of the stack.

Figure 9:
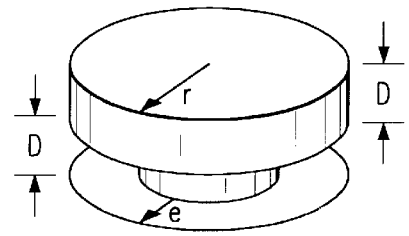
FIG. 9 shows a cross sectional view of a capacitor electrode with one groove.

Referring to FIG. 9 which represents an electrode with one corrugation, the gain in surface area, $SA_g$, is given by the equation:

$$SA_g = 2\pi e(2r-e), \qquad \text{(Eqtn. 2)}$$

where r is again the radius of the cylindrical stack to the outer surface and e is the distance from the inner surface of the corrugation to the outer surface of the cylindrical stack. The lost area, $SA_l$, is given by the equation:

$$SA_l = 2\pi eD, \qquad \text{(Eqtn. 3)}$$

where e is once again the distance from the inner surface of the corrugation to the outer surface as depicted and D is one half the thickness of the stack as depicted in FIG. 9. Therefore the net gain in surface area, $SA_n$, is given by the equation:

$$SA_n = SA_g - SA_l. \qquad \text{(Eqtn. 4)}$$

Therefore, to have a net gain that is greater than zero, e must be less than 2r−D.

The ratio, R, of the net gained area, $SA_n$, to the original side area, $SA_o$, is given by the equation:

$$R = (SA_g - SA_l)/SA_o = [e(2r-e-D)]/(2Dr). \qquad \text{(Eqtn. 5)}$$

For example, if e=0.05 microns, D=0.05 microns, and r=0.3 microns, then the ratio, R, of the net gained area, $SA_n$, to the original side area, $SA_o$, is 0.83. If, however, e=0.1 microns, while D and r remain the same as in the previous example, then the ratio, R, of the net gained area, $SA_n$, to the original side area, $SA_o$, is 1.50

Alternative Embodiment: Dry-Etch Method

Figure 3:
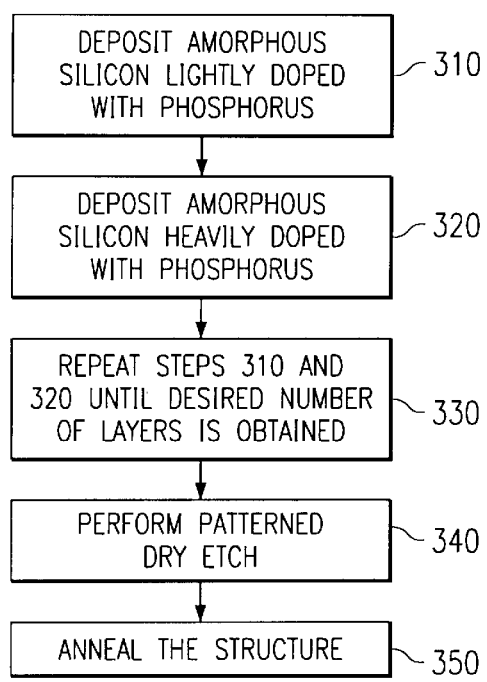
FIG. 3 is a flow chart showing key steps for forming a capacitor electrode with corrugations using an alternative method.
Figure 7:
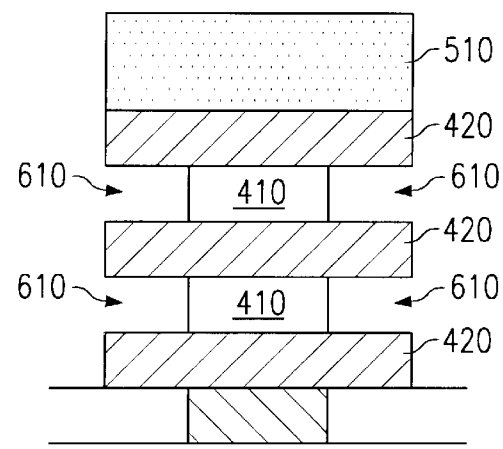
FIG. 7 shows a cross sectional view of the layered amorphous silicon structure of FIG. 4 after a patterned dry etch.

In an alternate embodiment, referring to FIG. 3, amorphous silicon lightly doped with phosphorous is deposited (step 310) on a partially fabricated integrated circuit followed by deposition of amorphous silicon heavily doped with phosphorous (step 320). Steps 310 and 320 are then repeated until the desired number of layers is obtained (step 330). Next, deposit a layer of photoresist and perform a patterned dry etch (step 340) to obtain a cylindrical column of amorphous silicon layers with corrugations etched in the side walls as depicted in FIG. 7. The dry etch simultaneously patterns the column and etches corrugations into the amorphous silicon. After performing the patterned dry etch (step 340), remove the photoresist and anneal the structure to redistribute the phosphorous such that the resulting column of amorphous silicon has a uniform concentration of phosphorous as depicted in FIG. 1, rather than a column of alternating layers of lightly doped and heavily doped amorphous silicon.

Capacitor with Horizontally Corrugated Electrodes

Figure 10:
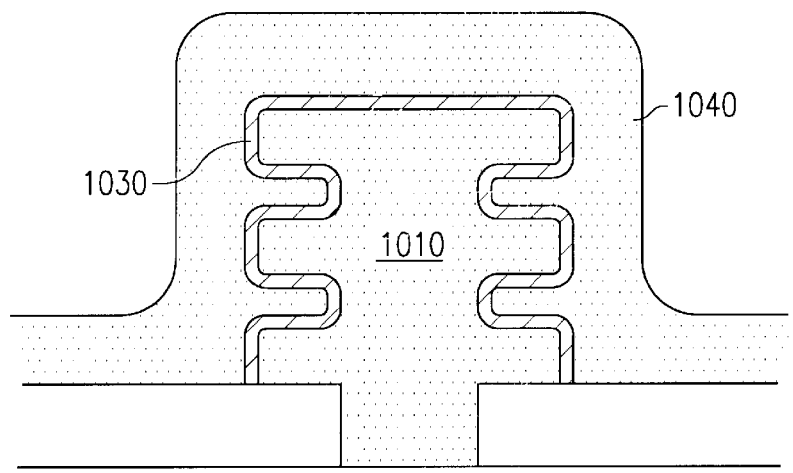
FIG. 10 shows a cross sectional view of a capacitor with horizontal corrugations in both electrodes.
Figure 11:
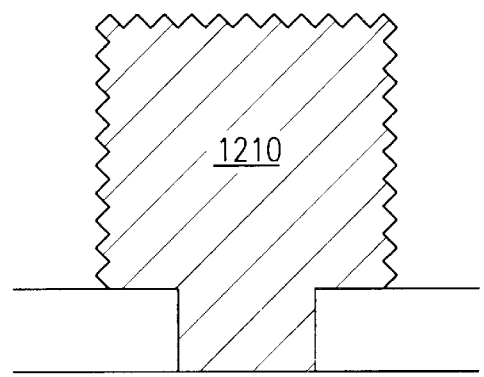
FIG. 11 depicts an example of other geometries for the inner capacitor electrode.
Figure 12:
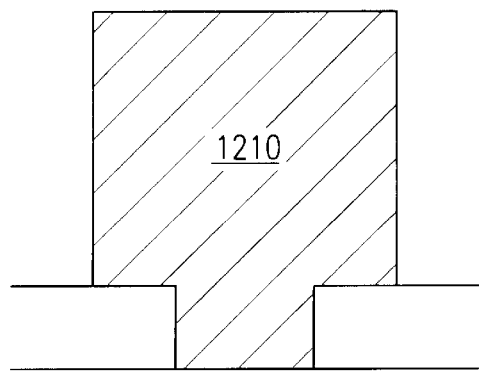
FIG. 12 shows a cross sectional view of an inner cylindrical capacitor electrode.
Figure 13:
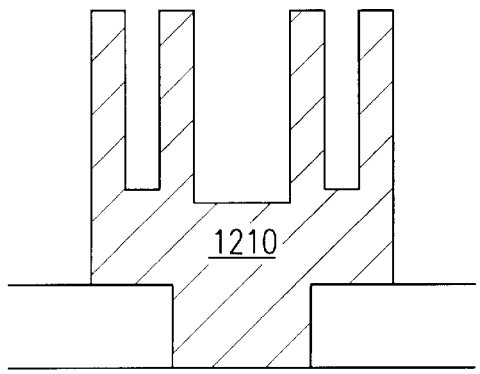
FIG. 13 depicts an example of other geometries for the inner capacitor electrode.

FIG. 10 depicts a capacitor 1001 with increased electrode surface area. The inner electrode 1010 has horizontal corrugations to increase the surface area of the electrode. A dielectric 1030 overlies the inner electrode separating the inner electrode from the outer electrode. An outer electrode 1040 overlies the dielectric having corrugations that are substantially complementary to the corrugations of the inner electrode. Both the dielectric 1030 and the outer electrode 1040 are preferably formed by chemical vapor deposition (CVD) so that both the dielectric 1030 and the outer electrode 1040 conform to the inner electrode. Thus the surface area of both the inner and outer electrodes is increased thereby increasing the amount of capacitance per unit area of the chip.

According to a disclosed class of innovative embodiments, there is provided: An integrated circuit capacitor, comprising: a vertically extended first electrode, said first electrode having horizontal corrugations therein; a dielectric conformally coating said first electrode; and a second electrode conformally coating said dielectric; wherein said first and second electrode have substantially complementary corrugation patterns.

According to another disclosed class of innovative embodiments, there is provided: An integrated circuit capacitor structure, comprising: a first and second electrodes which are separated by dielectric, and which have complementary corrugation patterns; where a first one of said electrodes has said corrugation pattern thereof corresponding to selective etching of a layered stack of thin film material.

According to another disclosed class of innovative embodiments, there is provided: A capacitor fabrication method, comprising the steps of: forming a first electrode having first horizontal corrugation patterns therein; depositing a dielectric material; and forming a second electrode having second horizontal corrugation patterns substantially complementary to said first corrugation patterns.

According to another disclosed class of innovative embodiments, there is provided: An electrode fabrication method, comprising the steps of: providing a partially fabricated integrated circuit surface; depositing alternating layers of material with different etching selectivities; performing a stack etch; performing a selective isotropic etch to form horizontal corrugations in said alternating layers of material; annealing said alternating layers of material to form an electrode of uniform dopant concentration with a larger surface area than a standard electrode.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the present teachings have been described with reference to amorphous silicon doped with phosphorous, as will be obvious to those skilled in the art, other conductive materials may be used. Furthermore, although the electrode is being described in a circular layout, it does not have to be circular. In fact, the electrode could be constructed in an oval or any of a myriad of other possible geometries.

What is claimed is:

1. An integrated circuit capacitor, comprising:

a vertically extended first electrode, said first electrode having horizontal corrugations therein;

a dielectric conformally coating said first electrode; and a second electrode conformally coating said dielectric;

wherein said first and second electrode have substantially complementary corrugation patterns.

2. An integrated circuit capacitor structure, comprising:

a first and second electrodes which are separated by dielectric, and which have complementary corrugation patterns;

where a first one of said electrodes has said corrugation pattern thereof corresponding to selective etching of a layered stack of thin film material.

3. An electrode comprising:

(a) a partially fabricated integrated circuit surface;

(b) alternating layers of like conductivity type doped material with different etching selectivities to form a stack on said surface;

(c) a stack sidewall extending along all of said alternating layers;

(d) corrugations extending from said sidewall toward the center of said stack in alternating ones of said alternating layers of material; and (e) means for annealing said alternating layers of material with said corrugations to provide an electrode of uniform dopant concentration with a larger surface area than a standard electrode.

4. The electrode of claim 3 wherein said alternating layers of material with different etching selectivities comprise layers of amorphous silicon, alternating layers of said amorphous silicon being relatively highly doped and the other of said alternating layers of said amorphous silicon being relatively lightly doped.

5. The electrode of claim 3 wherein said step of performing a selective isotropic etch to form corrugations toward the center of said stack in alternating ones of said alternating layers of material comprises the step of etching toward the center of said stack alternating ones of said layers.

6. The electrode of claim 4 wherein said step of performing a selective isotropic etch to form corrugations toward the center of said stack in alternating ones of said alternating layers of material comprises the step of etching toward the center of said stack alternating ones of said layers.

7. The electrode of claim 4 wherein the dopant for each of said layers is the same.

8. The electrode of claim 6 wherein the dopant for each of said layers is the same.

9. The electrode of claim 3 wherein said layers are deposited in a single deposition run.

10. The electrode of claim 8 wherein said layers are deposited in a single deposition run.

* * * * *